United States Patent
Nakai et al.

[11] Patent Number: 5,741,717
[45] Date of Patent: Apr. 21, 1998

[54] METHOD OF MANUFACTURING A SOI SUBSTRATE HAVING A MONOCRYSTALLINE SILICON LAYER ON INSULATING FILM

[75] Inventors: Tetsuya Nakai; Hiroshi Shinyashiki, both of Saitama-ken; Yasuo Yamaguchi; Tadashi Nishimura, both of Hyogo-ken, all of Japan

[73] Assignees: Mitsubishi Denki Kabushiki Kaisha; Mitsubishi Material Corporation, both of Tokyo, Japan

[21] Appl. No.: 391,283

[22] Filed: Feb. 21, 1995

Related U.S. Application Data

[63] Continuation of Ser. No. 857,425, Mar. 26, 1992, abandoned.

[30] Foreign Application Priority Data

Mar. 27, 1991 [JP] Japan .................................. 3-062973

[51] Int. Cl.$^6$ ...................................... H01L 21/76
[52] U.S. Cl. ................................. 437/24; 437/26; 437/62
[58] Field of Search .................. 148/DIG. 85, DIG. 86, 148/DIG. 83; 437/24, 26, 62

[56] References Cited

U.S. PATENT DOCUMENTS

| | | | |
|---|---|---|---|
| 4,676,841 | 6/1987 | Celler | 437/24 |
| 4,804,633 | 2/1989 | Macelwee et al. | 437/24 |
| 4,975,126 | 12/1990 | Margail et al. | 437/24 |

FOREIGN PATENT DOCUMENTS

| | | |
|---|---|---|
| 0328817A2 | 8/1989 | European Pat. Off. |
| 0328817A3 | 8/1989 | European Pat. Off. |
| 59-94411 | 5/1984 | Japan |

OTHER PUBLICATIONS

"New Trends in Simox," Ommen, 2107B Nuclear Instrum. & Methods in Phys. Res./B, Mar. 1989, pp. 194–202.

"The Effects of Different Implantation and Annealing Temperatures on the Structural and Chemical Properties of High Dose Oxygen–ion–implanted Silicon", Tuppen et al., 2194 Thin Solids Films, Sep. 1985, pp. 233–244.

Effects of Oxygen Concentration and Annealing Sequence on Microstructure of Separation by Implanted Oxygen Wafer with High–Temperature Annealing, Kawazu et al., Japanese Journal of Applied Physics, vol. 30, Jan. 1991, pp. 112–115.

"Practical Reduction of Dislocation Density in Simox Wafers", Stevenage, Electronics Letters, vol. 26, No. 20, Sep. 1990, pp. 1647–1649.

Hemment, P. et al., "Nucleation and Growth of $SiO_2$ Precipitates . . . Oxygen Profiles", Nuclear Instruments and Methods in Physics Research B39 (1989) pp. 210–214.

(List continued on next page.)

*Primary Examiner*—George Fourson
*Attorney, Agent, or Firm*—Lowe, Price, LeBlanc & Becker

[57] ABSTRACT

Oxygen ion is implanted into a silicon substrate to remain a silicon layer on a surface of the silicon substrate. In this state, a silicon oxide layer is formed under the silicon layer. Silicon oxide particles are formed and remained in the residual silicon layer. While maintaining this state, the silicon substrate is heated to a predetermined temperature not less than 1300° C. Alternatively, the silicon substrate is heated at a high temperature-rise rate to 900°–1100° C., and thereafter is heated at a low temperature-rise rate to the temperature not less than 1300° C. The silicon substrate is held at the predetermined temperature not less than 1300° C. for a predetermined time, whereby crystallinity of the residual silicon layer is restored. A pinning effect of the silicon oxide particles prevents the rise of dislocation to the surface of the SOI layer, and also suppresses a rate per a unit time at which interstitial silicon generates during the heating to the high temperature region. Therefore, a dislocation density of the SOI layer can be reduced.

10 Claims, 7 Drawing Sheets

OTHER PUBLICATIONS

"Dislocation Formation Related With High Oxygen Dose Implantation on Silicon", J. Appl. Phys. 69(2), by J. Stoemenos et al, Jan. 15, 1991.

"The Reduction of Dislocations in Oxygen Implanted Silicon–on–Insulator Layers by Sequential Implantation and Annealing", J. Appl. Phys. 63(10), by Dale Hill et al, May 15, 1988.

"The Formation of Low Dislocation Density Silicon–on–Insulator by a Single Implantation and Annealing", Appl. Phys. Lett. 57(2), by M.K. EL–Ghor et al, Jul. 9, 1990.

Jastrzebski, L., et al, "The Effect of 1300–1380° C . . . CMOS/SIMOX Devices", IEEE Electron Device Letters, vol. 9, No. 3, Mar. 1988, pp. 151–153.

Brady, F., "C–V and C–t Analysis . . . Implantation", Journal of Electronic Mat., vol. 18, No. 3, 1989, pp. 385–389.

SURFACE →

METHOD OF MANUFACTURING A SOI SUBSTRATE HAVING A MONOCRYSTALLINE SILICON LAYER ON INSULATING FILM

This application is a continuation of application Ser. No. 07/857,425 filed Mar. 26, 1992, now abandoned.

BACKGROUND OF THE INVENTION

1. Field of the Invention

The present invention relates to a method for manufacturing an SOI (Silicon on Insulator) substrate which has a monocrystal silicon layer on an insulating film and has attracted the attention as a substrate of a VLSI in the future, and particularly to a method, which enables manufacturing of the SOI substrate having a low defect density of the monocrystal silicon layer.

2. Description of the Related Art

FIGS. 9A-9C are cross sectional views, which show an example of a conventional manufacturing method of the SOI substrate, and specifically an SIMOX (Separation by Implanted Oxygen) method for manufacturing the SOI substrate in accordance with the steps.

In the SIMOX method, oxygen is ion-implanted at an implantation dose of about $2\times10^{18}/cm^2$ into a silicon substrate by an accelerating voltage of about 200 keV, and then annealing or heat treatment is sufficiently applied to the substrate in gas mixture of $Ar/O_2$ or $N_2/O_2$ at a high temperature not less than 1300° C., so that a silicon oxide layer ($SiO_2$ film), i.e., a buried insulating film is directly formed in the silicon substrate. A conventional manufacturing method of the SOI substrate will be described below.

First, a silicon substrate 1 shown in FIG. 9A is heated to 500°–600° C. In this state, as shown in FIG. 9B, oxygen ion 2 is implanted into silicon substrate 1 at the implantation dose of about $2.0\times10^{18}/cm^2$ by the accelerating voltage of 200 keV. Silicon substrate 1 and the oxygen which is directly implanted thereinto react with each other to form a buried silicon oxide film 3.

FIG. 12 shows a density profile of oxygen in the silicon substrate in the cases that oxygen ion is implanted at various implantation doses by the accelerating voltage of 200 keV. With reference to FIG. 12, if the implantation dose of the oxygen ion is low, the oxygen shows a Guassian distribution in the silicon substrate. However, if the oxygen ion implantation dose is higher than a critical implantation dose of $1.35\times10^{18}/cm^2$, an oxygen concentration near an implantation peak exceeds a stoichiometric concentration of $SiO_2$, i.e., $4.4\times10^{22}/cm^3$, so that an $SiO_2$ film is formed. Excessive oxygen diffuses toward a base of the distribution, and reacts on the silicon substrate to form $SiO_2$, so that the interface between the $SiO_2$ film and the silicon substrate becomes steep. This reaction can be expressed in the following formula.

$$xSi+2O_i \rightarrow SiO_2+(x-1)Si_i \qquad (1)$$

wherein $O_i$ is interstitial oxygen, and $Si_i$ is interstitial silicon. In this reaction, the interstitial silicon is emitted in response to the increase in volume (by 2.25 times) caused by the formation of the $SiO_2$ layer. This interstitial silicon is absorbed into the surface of the silicon substrate which forms a sink. However, as the implantation dose of oxygen ion increases, the number of the generated interstitial silicon increases, and the excessive interstitial silicon will be coupled together to form a defect in a residual silicon layer 4 (FIG. 9B).

Residual silicon layer 4 is damaged by the ion implantation, and also has a high oxygen concentration and the above described defect. Therefore, layer 4 requires heat treatment, for example, in an atmosphere of $Ar/O_2$ at a temperature of 1300° C. for 5 hours, in order to restore crystallinity of the residual silicon layer 4. In a conventional heat treatment step, as shown in FIG. 10, silicon substrate 1 is heated at a constant temperature-rise rate until it reaches a holding temperature (1300° C.). FIG. 11 shows a time chart of this typical heat treatment step. According to the typical heat treatment, the temperature is raised at the temperature-rise rate of, e.g., 20° C./min. to 1300° C., and then is held in the atmosphere of argon (Ar) and a very small amount of oxygen ($O_2$) mixed therein for 6 hours. Thereafter, it is cooled in a furnace for about two hours nearly to a room temperature. By the heat treatment, residual silicon layer 4 is reformed into a monocrystal silicon layer (SOI layer) 5 (FIG. 9C). Meanwhile, in accordance with the progress of the reaction of formula (1), the thickness of the $SiO_2$ layer 3 increases, and silicon oxide particles functioning as oxygen precipitate in the residual silicon layer 3 are captured into $SiO_2$ layer 3 due to melting or coupling, resulting in the steep $SiO_2$ layer 3 having only one interface. Growth or dissolution of silicon oxide particles, i.e., the oxygen precipitate depends on a critical radius $r_o$ expressed by the following equation.

$$r_o=(2\sigma/\Delta H_V)\cdot(T_E/(T_E-T)) \qquad (2)$$

$\Delta H_V$: enthalpy of formation of the $SiO_2$ phase per unit volume $\sigma$: Si/$SiO_2$ interface energy per unit surface $T_E$: equilibrium temperature $T$: heat treatment temperature In accordance with the equation (2), as heat treatment temperature T increases, a value of $(T_E-T)$ decreases, so that critical radius $r_o$ increases. Therefore, as heat treatment temperature T increases, the precipitate having a radius smaller than critical radius $r_o$ dissolves. Also, the heat treatment generates a large amount of interstitial silicon, a part of which is absorbed into the surface. The excess interstitial silicon, causes the generation and growth of the defect, and ultimately the defect is stabilized in the form of a threading dislocation 6 which fixedly penetrates a surface 51 of monocrystal silicon layer 5 and an interface between monocrystal silicon layer 5 and silicon oxide film 3, as shown in FIG. 9C. Threading dislocation 6 remains in monocrystal silicon layer 5 deteriorating the crystal quality thereof. A mechanism of formation of such dislocation is disclosed, for example, in J. Stoemenos et al., J. Appl. Phys., Vol. 69, NO. 2, 15 Jan. 1991, pp. 793-802.

The density of the threading dislocation depends on conditions for implanting the oxygen ion. As shown in FIG. 13, the higher implantation dose of oxygen ion and the lower accelerating voltage tend to increase the dislocation density. A multiple ion implanting (multi-step implanting) method utilizing the correlativity between the implantation dose of oxygen ion and the dislocation density (defect density) has been developed and reported in D. Hill et al., J. Appl. Phys., Vol. 63, No. 10, 15 May 1988, pp. 4933–4936. In this method, the oxygen ion is implanted at the implantation dose (in a range from 0.5 to $1\times10^{18}/cm^2$) lower than the conventional dose in order to reduce the dislocation density, and then annealing is conducted in order to restore the crystallinity of the monocrystalline silicon layer and grow the $SiO_2$ layer. Thereafter, the implantation of oxygen ion and the annealing are repeated for few times in order to obtain a predetermined implantation dose. This method can produce the good SOI substrate, in which the interface between the monocrystal silicon layer and the silicon oxide film is very steep, and also the dislocation density of the monocrystal silicon layer is lower than $10^3/cm^2$. This method, however, requires complicated processes, and thus is not suitable to a commercial mass production.

Another method for reducing the dislocation density has been proposed in M. K. EL-Ghor et al., Appl. Phys., Lett., Vol. 57, No. 2, 9 Jul. 1990, pp 156-158. In this method, cavities are formed in the SOI layer at a high density during the implantation of oxygen ion. The cavities act as a sink for the interstitial silicon and thus reduce the dislocation density.

Since conventional manufacturing method of the SOI substrate is conducted as shown in FIGS. 9A-9C, the threading dislocation remains in the SOI layer at a density of about $10^8/cm^2$. If the threading dislocation remains, and thus MOS transistors are formed in the SOI layer having deteriorated crystal quality, the defect and/or impurity is captured into the gate oxide film when the gate oxide film is formed, which reduces the resistance against the electric field of the gate oxide film. Also the defect existing in the depleted layer causes a generation current, which increases power consumption. As described above, if the MOS transistors are formed in the SOI layer containing the residual threading dislocation, characteristics of the device deteriorate.

Although the multiple ion implanting method provides the good SOI substrate having the low dislocation density, it requires the complicated processes, and is not suitable to the commercial mass production.

SUMMARY OF THE INVENTION

An object of the invention is to manufacture an SOI substrate having a low defect density in the monocrystal silicon layer (SOI layer).

Another object of the invention is to provide a manufacturing method of an SOI substrate, which can improve crystallinity of an SOI layer by a simple process.

Still another object of the invention is to provide a manufacturing method of an SOI substrate, which the rise of dislocation to the surface of an SOI layer in a heat treatment step.

Yet another object of the invention is to provide a manufacturing method of an SOI substrate, in which a generating rate of interstitial silicon is suppressed in a heat treatment step.

A manufacturing method of an SOI substrate according to an aspect of the invention, oxygen ion is implanted into a silicon substrate, so that a silicon oxide layer is formed under a silicon surface layer while retaining the silicon surface layer on a main surface of the silicon substrate. While maintaining a state in which silicon oxide particles are formed and retained in the silicon surface layer, the silicon substrate is heated to a predetermined temperature not less than 1300° C. The silicon substrate is held at the predetermined temperature for a predetermined time, whereby crystallinity of the silicon surface layer is restored.

In a preferred embodiment of the manufacturing method of the SOI substrate described above, the step, in which the silicon substrate is heated to the predetermined temperature not less than 1300° C., is conducted by a step, in which the silicon substrate is heated to a first temperature in a range from 900° C. to 1100° C. at a first temperature-rise rate, and a step, in which the silicon substrate is heated from the first temperature to a second temperature not less than 1300° C. at a second temperature-rise rate lower than the first temperature-rise rate. Preferably, the step, in which the silicon substrate is heated to the predetermined temperature not less than 1300° C., includes a step in which the silicon substrate is held at the first temperature for a constant time.

In the manufacturing method according to the aspect of the invention, the silicon substrate is heated while retaining the silicon oxide particles in the silicon surface layer. Therefore, the silicon oxide particles formed and retaining in the silicon surface layer prevent dislocations from rising to and extending in a surface of the silicon surface layer by their pinning effect. This can prevent the dislocation from rising to the surface of the SOI layer (monocrystal silicon layer). Owing to the pinning effect described above, the existence of the silicon oxide particles prevents multiplication of the dislocation and stabilizes the same. Thereby, the dislocation density of the SOI layer can be remarkably reduced.

In a manufacturing method of an SOI substrate according to another aspect of the invention, oxygen ion is implanted into a silicon substrate, so that a silicon oxide layer is formed under a silicon surface layer while retaining the silicon surface layer on a main surface of the silicon substrate. The silicon substrate is heated to a first temperature at a first mean temperature-rise rate. The silicon substrate is heated from the first temperature to a second temperature not less than 1300° C. at a second mean temperature-rise rate lower than the first mean temperature-rise rate. The silicon substrate is held at the second temperature for a predetermined time, whereby crystallinity of the silicon surface layer is restored.

According to a preferred embodiment of the manufacturing method described above, the first temperature is 1050° C., and the second temperature is 1300° C. The first mean temperature-rise rate is 20° C./min., and the second mean temperature-rise rate is not more than 1° C./min.

In the manufacturing method of the SOI substrate according to the another aspect of the invention, the silicon substrate is heated to the first temperature at the first mean temperature-rise rate, and is heated from the first temperature to a final heat treatment temperature, i.e., the second temperature not less than 1300° C. at the lower second mean temperature-rise rate. Therefore, the rate of generation of interstitial silicon per a unit time can be suppressed. This results in reduction of a retaining density of the interstitial silicon in the SOI layer (monocrystal silicon layer) thus obtained. Thereby, the dislocation density of SOI layer can be remarkably reduced.

In the method for manufacturing the SOI substrate by the SIMOX method according to the invention, as described above, the rise of the dislocation to the SOI layer surface can be prevented by the pinning effect of the residual silicon oxide particles, which are formed in the heating step of the silicon substrate after the implantation of oxygen ion. Further, the generating rate of the interstitial silicon per a unit time can be suppressed in the above heating step. Accordingly, the SOI substrate having the remarkably reduced dislocation density and the improved crystallinity can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Manufacturing steps of an SOI substrate according to an embodiment of the invention will be described below. The step for implanting oxygen ion is the same as the conventional step. That is a silicon oxide film is formed by reaction of a silicon substrate and oxygen directly implanted into the silicon substrate.

Figure 1:
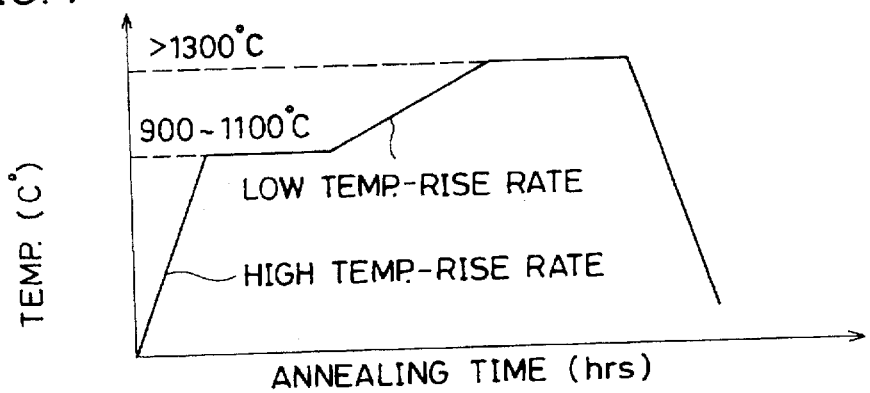
FIG. 1 is a time chart conceptionally showing a heat treatment step in a manufacturing method of an SOI substrate according to an embodiment of the invention.

Then, an annealing or heat treatment step is conducted to restore crystallinity of the silicon oxide film and a silicon surface layer (silicon crystal) formed thereon. In this embodiment, the heat treatment step is conducted, using the heating steps in two stages, as shown in FIG. 1. In the first heating step, the silicon substrate is heated at a constant temperature-rise rate, and is held for few hours at a constant temperature in a range from 900° C. to 1100° C. In the second heating step, the silicon substrate is heated at a temperature-rise rate, which is lower than that in the heating step at the first stage, to a final heat treatment temperature not less than 1300° C. The silicon substrate is held at this final heat treatment temperature for few hours, and then is cooled in a furnace.

Figure 2:
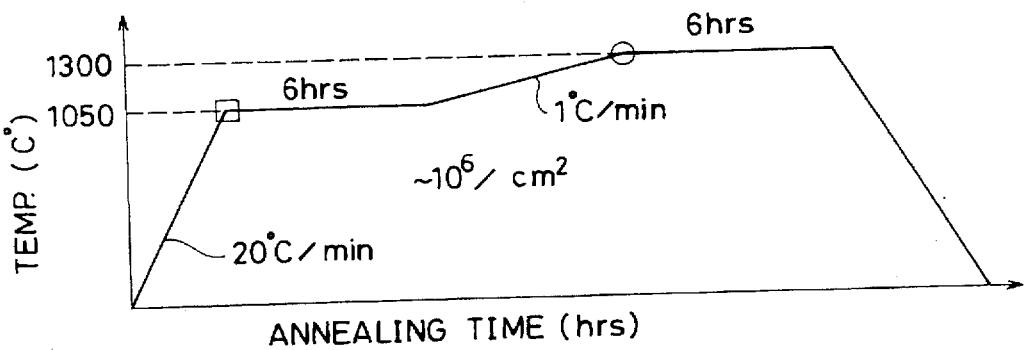
FIG. 2 is a time chart showing a first example of a heat treatment step in a manufacturing method of an SOI substrate according to the invention.

A typical example of the heating steps at the two stages will be described below. With reference to FIG. 2, the silicon substrate is heated at the temperature-rise rate of 20° C./min., and is held at 1050° C. for six hours in the first heating step. In the second heating step, the silicon substrate is heated at the temperature-rise rate of 1° C./min., and is held at 1300° C. for six hours. Thereafter, the silicon substrate is cooled in the furnace for about two hours nearly to room temperature. Atmosphere in the furnace accommodating the silicon substrate contains argon (Ar) and a very small amount of oxygen ($O_2$) mixed therein.

The temperature-rise rate in the second heating step shown in FIG. 2 is lower than the temperature-rise rate in the first heating step. In connection with this, only a following relationship is required that a mean temperature-rise rate in the second heating step is lower than the mean temperature-rise rate in the first heating step. That is; the mean temperature-rise rate in the first heating step shown in FIG. 2 is 20° C./min., and the mean temperature-rise rate in the second heating step is $(1300-1050)/(360+250/1)=0.41$ (°C./min.). The second mean temperature-rise rate shown in FIG. 2 is lower than the first mean temperature-rise rate.

Figure 3:
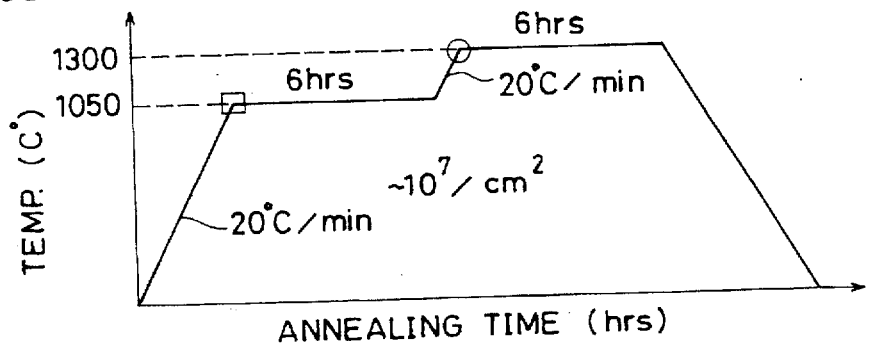
FIG. 3 is a time chart showing a second example of a heat treatment step in a manufacturing method of an SOI substrate according to the invention.

The above conditions are also satisfied by another example of the heating steps shown in FIG. 3. The mean temperature-rise rate in the first heating step shown in FIG. 3 is 20° C./min., and the mean temperature-rise rate in the second heating step is $250/(360+250/20)=0.67$ (°C./min.). As described above, the effect of the invention can be achieved only if the mean temperature-rise rate in the second heating step is smaller than the mean temperature-rise rate in the first heating step.

Figure 4:
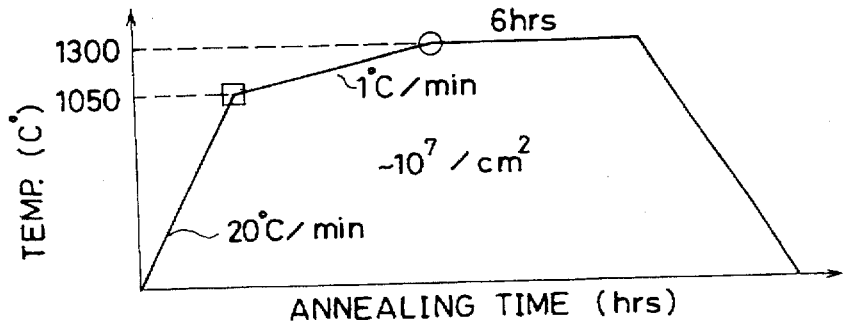
FIG. 4 is a time chart showing a third example of a heat treatment step in a manufacturing method of an SOI substrate according to the invention.

Further, in an example shown in FIG. 4, the silicon substrate is heated at the temperature-rise rate of 20° C./min. in the first heating step, and the process advances, without holding 1050° C., to the second heating step, in which the substrate is heated at the temperature-rise rate of 1° C./min. Then, it is held at 1300° C. for six hours. The effect of the invention can be achieved, even if the silicon substrate is not held at a constant temperature through the intermediate stage in the heating step.

Figure 5A:
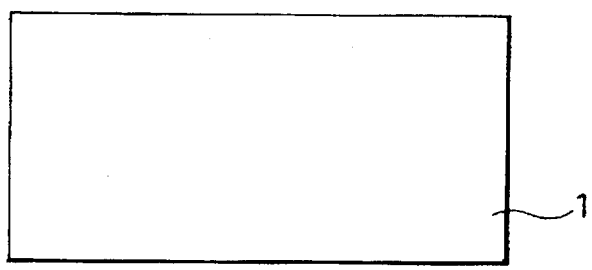
FIGS. 5A–5D are cross sectional views showing states of a wafer at respective steps in a manufacturing method of an SOI substrate according to an embodiment of the invention.
Figure 5B:
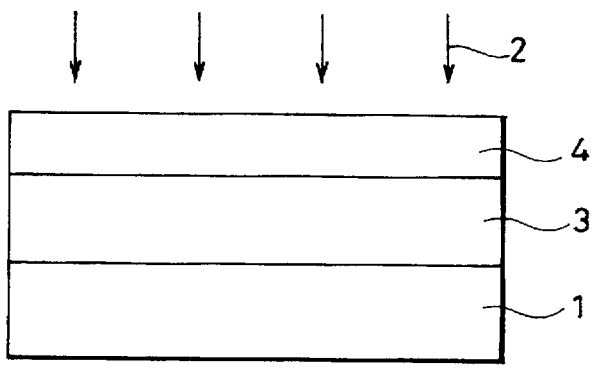

Now, the manufacturing method of the SOI substrate of the invention will be described below in accordance with the steps. A monocrystal silicon substrate 1 shown in FIG. 5A is heated to 500° C.–600° C. In this state, as shown in FIG. 5B, oxygen ion 2 is implanted into silicon substrate 1, for example, at the implantation dose of $2.0\times10^{18}/cm^2$ by the accelerating voltage of 200 keV. The oxygen directly implanted into silicon substrate 1 reacts on silicon substrate 1 to form a silicon oxide film 3. Residual silicon layer 4 is formed on a silicon oxide film 3.

Figure 5C:
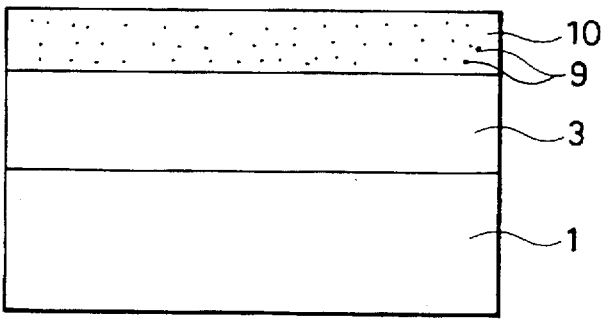

In a temperature maintaining step, the substrate is held at the intermediate stage in the heating step for a few hours, or the temperature-rise rate is lowered, whereby silicon oxide particles 9, i.e., fine oxygen precipitate having a particle diameter of about tens angstroms is formed in a whole interior of an SOI layer 10, as shown in FIG. 5C. Existence of silicon oxide particles 9 brings about the pinning effect, by which dislocation near the interface between silicon oxide film 3 and SOI layer 10 is suppressed from rising to the surface of SOI layer 10. If the dislocation reached the surface of SOI layer 10, it would be difficult to remove the same by any processing applied thereafter. Therefore, the pinning effect has an important part in reducing the dislocation density.

In the temperature region of 900°–1100° C., however, the silicon and oxygen are not sufficiently rearranged. Therefore, the heat treatment at the high temperature is required so as to obtain the silicon oxide layer having the desired steep interface and the SOI layer excluding the defect such as dislocation and precipitate. Since the reaction by which the silicon oxide layer is formed is most remarkable in the high temperature region, it is important to suppress the rise of the dislocation in the high temperature region in order to prevent the formation of the threading dislocation. In this embodiment, the pinning effect of the silicon oxide particles, i.e., the oxygen precipitate formed in the first heating step suppresses the rise of the dislocation in the high temperature region. In order to prevent the rise of the dislocation even in the high temperature region by the pinning effect of the silicon oxide particles, it is necessary to suppress the melting of the silicon oxide particles, which may be melted by the raised temperature. If the temperature-rise rate were high, the critical radius would increase at a rate higher than a growing rate of the silicon oxide particles, so that nearly all silicon oxide particles, i.e., the precipitate near the surface, would dissolve. The generating rate per a unit time of the interstitial silicon which generates during the rise of the temperature depends on the temperature-rise rate. If the temperature-rise rate were excessively high, a large mount of interstitial silicon would generate, and the dislocation would generate due to the mutual coupling of the interstitial silicon near the surface and the growth. For these reasons, it is important that the temperature is raised from a value in the intermediate stage to a value in the high temperature region at the temperature-rise rate which does not cause the melting of the silicon oxide particles deposited and grown in the intermediate stage, in order to reduce the dislocation density. The silicon oxide particles, i.e., the precipitate remained in the temperature rising step can be completely melted in the heat treatment conducted at the temperature above 1300° C. for few hours, and thus the steep interface between the silicon oxide layer and the SOI layer can be obtained.

Figure 5D:
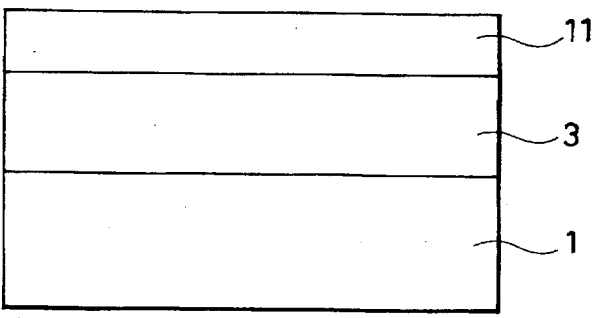

In this manner, the SOI layer 11 having the reduced dislocation density is formed, as shown in FIG. 5D.

A mechanism of generation of the interstitial silicon will be described below. Although the formula (1) expresses an actual relationship of x=2.25 ($SiO_2$ has a volume 2.25 times as large as that of Si), it is assumed that they have a relationship of x=9 in the following description of the generating processes of the interstitial silicon, for the purposes of description.

Figure 6A:
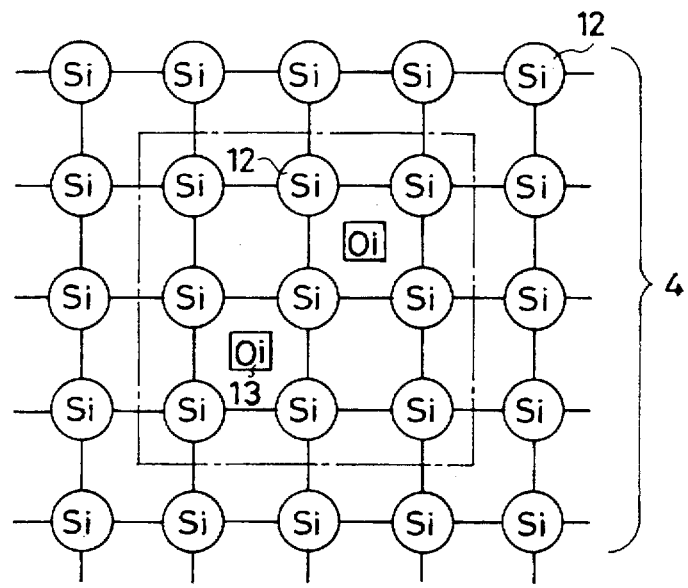
FIGS. 6A–6C are diagrams showing processes in which interstitial silicon generates in a silicon layer containing an implanted oxygen ion.

With reference to FIG. 6A, description will be made with respect to nine atoms of lattice silicon 12 surrounded by alternate long and short dash line. It is assumed that ion-implanted oxygen 13 exists in the lattice in the region surrounded by the alternate long and short dash line. Residual silicon layer 4 is formed of lattice silicon 12.

Figure 6B:
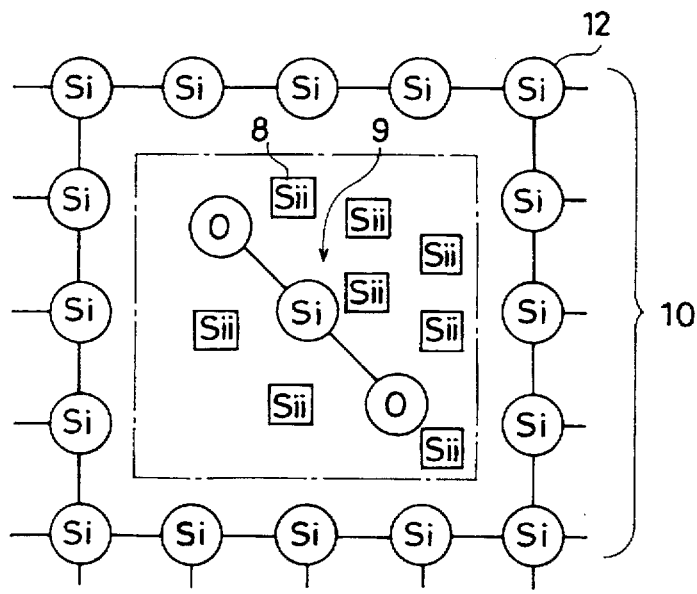

As shown in FIG. 6B, the reaction expressed by formula (1) is carried out, resulting in deposited silicon oxide particle 9. Eight atoms of interstitial silicon 8 generate around silicon oxide particle 9.

Figure 6C:
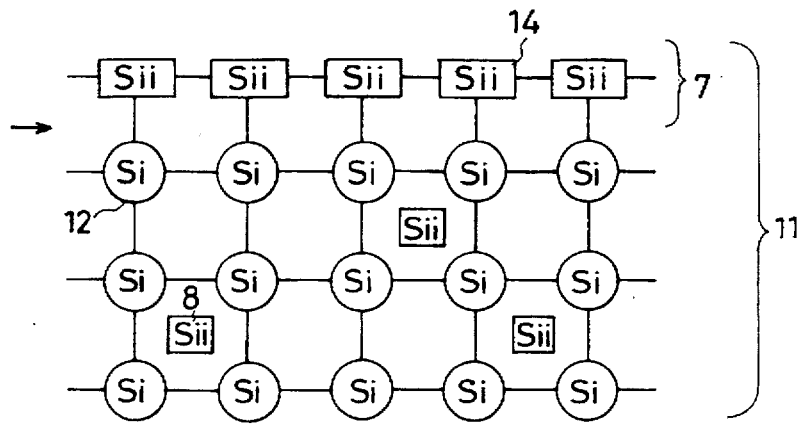

The generating rate per a unit time of interstitial silicon 8 thus generated depends on the temperature-rise rate, and increases as the temperature-rise rate increases. However, as shown in FIG. 6C, a part of interstitial silicon 8 is absorbed into the surface of SOI layer 11. That is; a part of interstitial silicon 8 escapes to the surface of SOI layer 11, and is captured, as epitaxial growth silicon 14, into the lattice silicon to form an epitaxial growth layer 7. In this case, if the generating rate of interstitial silicon 8 were higher than the rate of the epitaxial growth caused on the surface of SOI layer 11, the interstitial silicon would mutually couple to form cluster, and might further grow to form a new surface in the silicon crystal, resulting in a crystal defect such as dislocation. In the embodiment of the invention, the generating rate per a unit time of the interstitial silicon is reduced so as to prevent or minimize the generation of the crystal defect. For this purpose, a method for reducing the rate of the temperature-rise from the intermediate stage to the high temperature region is employed. This reduces the residual density of the interstitial silicon in the SOI layer, and thus can reduce the dislocation density.

Figure 7:
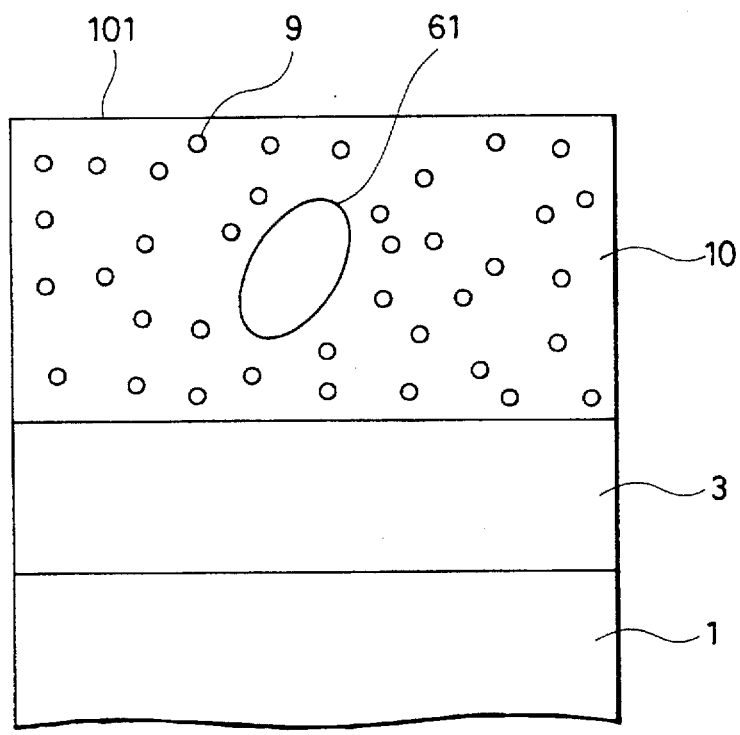
FIG. 7 is a cross sectional view for showing a manner in which residual silicon oxide particles prevent multiplication of dislocation in the invention.

According to the manufacturing method of the invention, as shown in FIG. 7, silicon substrate 1 is heated while remaining silicon oxide particles 9, which serves as the oxygen precipitate, in SOI layer 10. Therefore, even if dislocation 61 generates due to the mutual coupling and growth of the interstitial silicon, dislocation 61 is prevented from rising to a surface 101 of SOI layer 10 by the pinning effect of silicon oxide particles 9. This can reduce the dislocation density.

Figure 11:
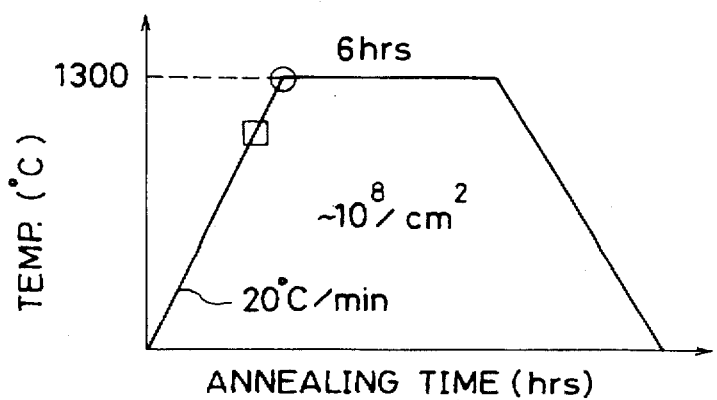
FIG. 11 is a time chart showing an example of a heat treatment step in a conventional manufacturing method of an SOI substrate.
Figure 12:
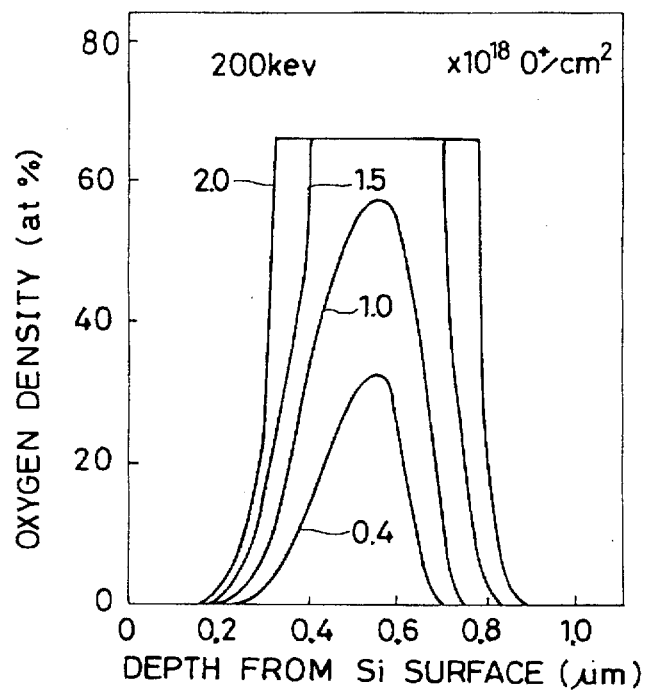
FIG. 12 shows variation of an oxygen density profile caused by increase of an implantation dose of oxygen ion.
Figure 13:
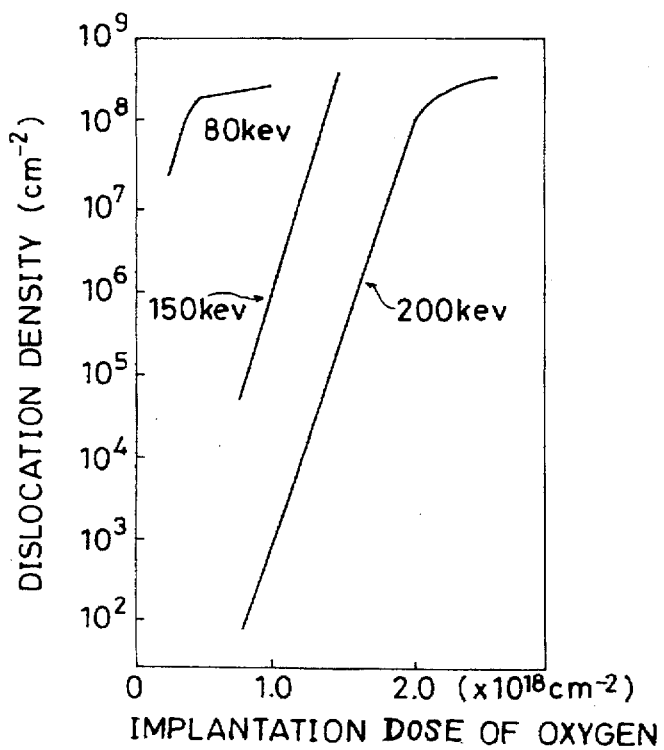
FIG. 13 shows dependency of a dislocation density of a silicon surface layer on an implantation dose of oxygen ion and an accelerating voltage.

In the embodiment of the invention, as described hereinabove, the annealing step is conducted in two stages, as shown in FIGS. 1–4, and the rise of the temperature to the high temperature region is conducted at the temperature-rise rate which prevents the dissolving of the silicon oxide particles, i.e., the oxygen precipitate formed in the intermediate stage. Therefore, the dislocation is suppressed from rising to the surface of the SOI layer by the pinning effect of the oxygen precipitate. Also, the generating rate per a unit time of the interstitial silicon can be suppressed. Consequently, the multiplication of the dislocation can be suppressed, and thus the generation of the threading dislocation can be prevented. Thereby, the dislocation density can be reduced to a value of about $10^6$–$10^7$/cm$^2$ (FIGS. 2–4), which is smaller than the conventional value of $10^8$–$10^9$/cm$^2$ (FIG. 11).

Further, according to the manufacturing method of the SOI substrate of the embodiment, the SOI substrate having the good crystallinity can be obtained, even if a high dose of oxygen ion is implanted at one time. Therefore, the manufacturing method of the invention does not require the complicated process, which is required in the conventional multiple ion implanting method, and can achieve a good mass productivity.

In the manufacturing method of the invention, if the multiple ion implanting method is employed as the method for implanting the oxygen ion, the dislocation density can be further reduced from about $10^3$/cm$^2$ to a range from about 10/cm$^2$ to $10^2$/cm$^2$.

If the MOS transistors are formed on the SOI substrate obtained by the invention, the resistance against the electric field of the gate oxide film is improved, resulting in reduction of the generation current, which is generated at the dislocation and is one of causes of leak current. Consequently, the junction leak current between source and drain is reduced, resulting in reduction of power consumption.

Figure 8:
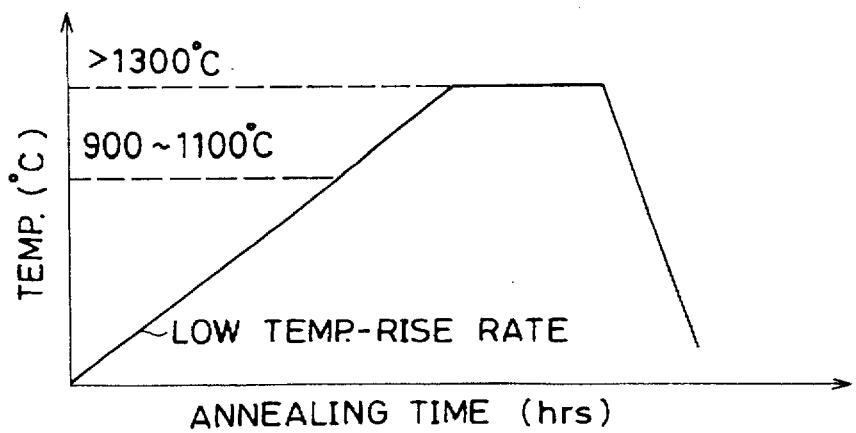
FIG. 8 is a time chart conceptionally showing a heat treatment step in a manufacturing method of an SOI substrate according to another embodiment of the invention.
Figure 9A:
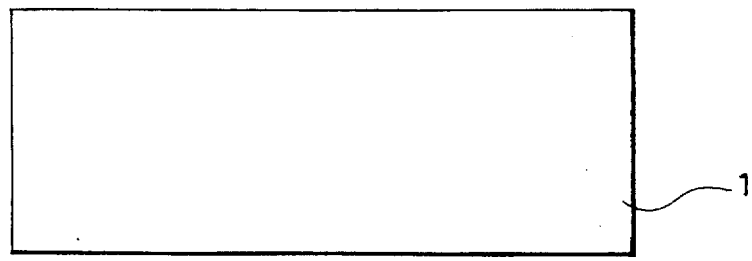
FIGS. 9A–9C are cross sectional views showing a conventional manufacturing method of an SOI substrate in accordance with steps.
Figure 9B:
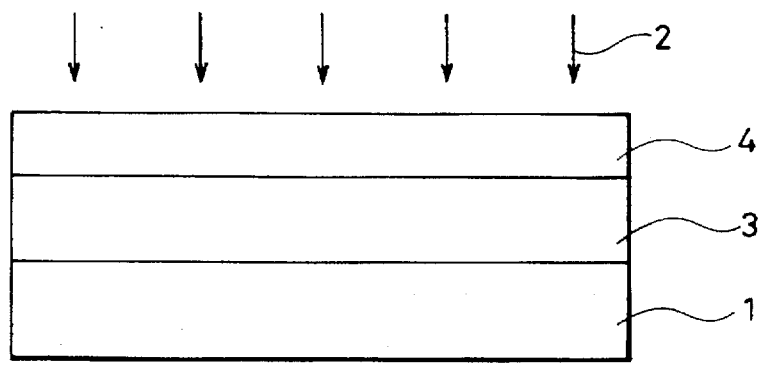
Figure 9C:
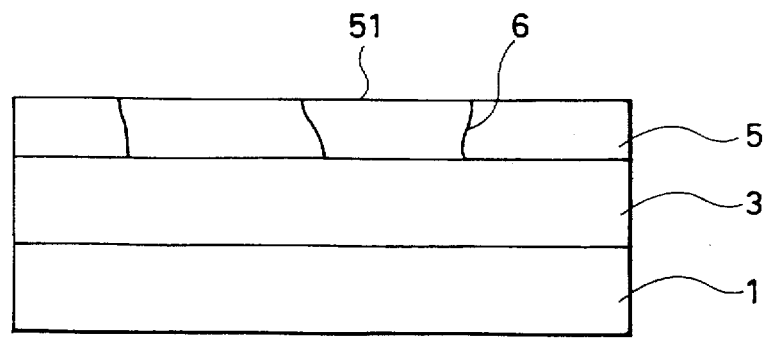
Figure 10:
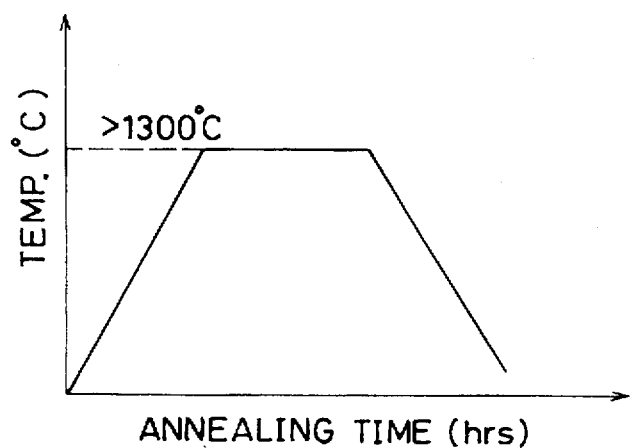
FIG. 10 is a time chart conceptionally showing a heat treatment step in a conventional manufacturing method of an SOI substrate.

In the foregoing description of the embodiment, the substrate is heated at the high temperature-rise rate to the temperature of the intermediate stage. Then, the substrate is held at this temperature of the intermediate stage for the constant time, or is not held, and thereafter it is heated at the low temperature-rise rate. That is; it has been described that the temperature-rise rate changes in the course of the heating steps. The substrate, however, may be heated at the low temperature-rise rate to the temperature in the high temperature region from the start of the first heating step. As shown in FIG. 8, the silicon substrate may be heated at the temperature-rise rate, e.g., a constant rate of 1° C./min. which does not cause the silicon oxide particles, i.e., oxygen precipitate to dissolve, to the temperature in the high temperature region from the start of the first heating step. In this case, the silicon oxide particles, i.e., oxygen precipitate is sufficiently formed in the SOI layer during the heating to the intermediate stage of 900°–1100° C., so that it is not necessary to provide the step, which is employed in the embodiment in FIG. 1 for growing the oxygen precipitate in the intermediate stage by holding the substrate for a constant time.

As described hereinabove, the invention provides the manufacturing method of the SOI substrate by the SIMOX method, in which the rise of the dislocation to the surface of the SOI layer can be prevented by the pinning effect of the residual oxygen precipitate remained in the heating step after the implantation of the ion. Also, in the heating operation to the high temperature region, the generating rate per a unit time of the interstitial silicon can be suppressed. Consequently, the SOI substrate having the reduced dislocation density and the good crystallinity can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an SOI substrate having a monocrystalline silicon layer on an insulating film comprising the following sequential steps:

implanting oxygen ion into a monocrystalline silicon substrate to form a silicon dioxide layer under a silicon surface layer while retaining said silicon surface layer on a main surface of said silicon substrate to form an oxygen ion implanted silicon substrate;

heating said oxygen ion implanted silicon substrate to a temperature greater than or equal to about 1300° C. wherein the temperature of the substrate is raised less than 1° C./min. from 1050° C. to 1300° C.; and holding said silicon substrate at said temperature for a period of time to restore crystallinity of said silicon surface layer.

2. A method of manufacturing an SOI substrate having a monocrystalline silicon layer on an insulating film comprising the following sequential steps:

implanting oxygen ions into a monocrystalline silicon substrate to form a silicon oxide layer under a silicon surface layer while retaining said silicon surface layer on a main surface of said silicon substrate to form an oxygen ion implanted silicon substrate;

heating said oxygen ion implanted silicon substrate to a first temperature at a first mean temperature-rise rate, the first temperature being in the range of 900° C. to 1100° C. to precipitate silicon oxide particles within an interior portion of said silicon surface layer but insufficient to cause the dissolution of the silicon oxide particles;

a temperature maintaining step comprising holding the temperature of said substrate at said first temperature for a period of time sufficient to precipitate silicon oxide particles, or wherein said first mean temperature-rise rate is such that silicon oxide particles are precipitated;

heating said silicon substrate to a second temperature at a second mean temperature-rise rate, said second temperature being greater than or equal to about 1300° C., and said second mean temperature-rise rate being equal to or less than 1° C./min and smaller than said first mean temperature-rise rate; and holding said silicon substrate at said second temperature for a time to restore the crystallinity of said silicon surface layer.

3. The method of manufacturing an SOI substrate according to claim 2, wherein said first temperature is about 1050° C., said first temperature-rise rate is about 20° C./min., said second temperature is about 1300° C., and said second mean temperature-rise rate is 1° C./min.

4. The method of manufacturing an SOI substrate according to claim 13, wherein said first temperature is about 1050° C., said first mean temperature-rise rate is about 20° C./min., said second temperature is about 1300° C., said second mean temperature-rise rate is about 1° C./min., and said time for holding said substrate at said first temperature is about 6 hours.

5. The method of manufacturing an SOI substrate according to claim 2, wherein said first temperature is about 1050° C., and said second temperature is about 1300° C.

6. The method of manufacturing an SOI substrate according to claim 5, wherein said first mean temperature-rise rate is about 20° C./min.

7. The method of manufacturing an SOI substrate according to claim 6, wherein said temperature maintaining step comprises holding the temperature at said first temperature for about six hours, and said second mean temperature-rise rate is about 1° C./min.

8. The method of manufacturing an SOI substrate according to claim 2, wherein said second mean temperature-rise rate is about 0.41° C./min.

9. The method of manufacturing an SOI substrate according to claim 2, wherein said second mean temperature-rise rate is about 0.67° C./min.

10. The method of manufacturing an SOI substrate according to claim 2, wherein the oxygen ion implanting step is repeated.

* * * * *

UNITED STATES PATENT AND TRADEMARK OFFICE
CERTIFICATE OF CORRECTION

PATENT NO. :
DATED       :   5,741,717
INVENTOR(S) :   April 21, 1998

Tetsuya NAKAI et al.

It is certified that error appears in the above-indentified patent and that said Letters Patent is hereby corrected as shown below:

In column 10, lines 24 to 25, change "according to claim 13" to --according to claim 2--.

Signed and Sealed this

Twenty-seventh Day of October, 1998

Attest:

BRUCE LEHMAN

*Attesting Officer*    *Commissioner of Patents and Trademarks*